(12) United States Patent
Iketani et al.

(10) Patent No.: US 10,446,356 B2
(45) Date of Patent: Oct. 15, 2019

(54) MULTILAYER PRINTED CIRCUIT BOARD VIA HOLE REGISTRATION AND ACCURACY

(71) Applicant: SANMINA CORPORATION, San Jose, CA (US)

(72) Inventors: Shinichi Iketani, San Jose, CA (US); Douglas Ward Thomas, Pacific Grove, CA (US)

(73) Assignee: SANMINA CORPORATION, San Jose, CA (US)

( * ) Notice: Subject to any disclaimer, the term of this patent is extended or adjusted under 35 U.S.C. 154(b) by 21 days.

(21) Appl. No.: 15/784,070

(22) Filed: Oct. 13, 2017

(65) Prior Publication Data

US 2018/0110133 A1     Apr. 19, 2018

Related U.S. Application Data

(60) Provisional application No. 62/407,807, filed on Oct. 13, 2016.

(51) Int. Cl.
*H01H 85/12*     (2006.01)
*H01H 85/055*    (2006.01)
(Continued)

(52) U.S. Cl.
CPC ........ *H01H 85/12* (2013.01); *H01H 85/0013* (2013.01); *H01H 85/055* (2013.01);
(Continued)

(58) Field of Classification Search
CPC ...... H01H 85/12; H01H 85/055; H01H 85/20; H01H 85/306; H01H 85/56; H05K 1/115;
(Continued)

(56) References Cited

U.S. PATENT DOCUMENTS

2006/0180346 A1   8/2006 Knight et al.
2006/0199390 A1   9/2006 Dudnikov, Jr. et al.
(Continued)

FOREIGN PATENT DOCUMENTS

EP     1180920 A2    2/2002

OTHER PUBLICATIONS

PCT/US2017/056681. International Search Report & Written Opinion (dated Apr. 26, 2018).

*Primary Examiner* — Peter Dungba Vo
*Assistant Examiner* — Azm A Parvez
(74) *Attorney, Agent, or Firm* — Loza & Loza, LLP; Julio M. Loza

(57) ABSTRACT

A method of making printed circuit board vias using a double drilling and plating method is disclosed. A first hole is drilled in a core, the first hole having a first diameter. The first hole is filled and/or plated with an electrically conductive material. A circuit pattern may be formed on one or two conductive layers of the core. A multilayer structure may then be formed including a plurality of cores that also include pre-drilled and plated via holes, wherein at least some of the pre-drilled and plated via holes are aligned with the first hole. A second hole is then drilled within the first hole and the aligned pre-drilled and plated holes, the second hole having a second diameter where the second diameter is smaller than the first diameter. A conductive material is then plated to an inner surface of the second hole.

12 Claims, 9 Drawing Sheets

Improved Hole Relative Position and Accuracy Process

(51) Int. Cl.

| | | |
|---|---|---|
| *H01H 85/20* | (2006.01) | |
| *H01H 85/30* | (2006.01) | |
| *H01H 85/56* | (2006.01) | |
| *H05K 1/11* | (2006.01) | |
| *H05K 1/14* | (2006.01) | |
| *H05K 3/00* | (2006.01) | |
| *H05K 3/10* | (2006.01) | |
| *H05K 3/40* | (2006.01) | |
| *H05K 3/46* | (2006.01) | |
| *H01H 85/00* | (2006.01) | |
| *H01H 85/143* | (2006.01) | |
| *H01H 1/58* | (2006.01) | |
| *H01H 85/02* | (2006.01) | |
| *H05K 3/06* | (2006.01) | |
| *H01H 85/06* | (2006.01) | |

(52) U.S. Cl.
CPC .......... *H01H 85/143* (2013.01); *H01H 85/20* (2013.01); *H01H 85/306* (2013.01); *H01H 85/56* (2013.01); *H05K 1/115* (2013.01); *H05K 1/144* (2013.01); *H05K 3/0047* (2013.01); *H05K 3/108* (2013.01); *H05K 3/4076* (2013.01); *H05K 3/462* (2013.01); *H05K 3/4623* (2013.01); *H05K 3/4638* (2013.01); *H01H 85/06* (2013.01); *H01H 2001/5877* (2013.01); *H01H 2085/025* (2013.01); *H01H 2085/0555* (2013.01); *H05K 3/06* (2013.01); *H05K 2201/0338* (2013.01); *H05K 2201/041* (2013.01); *H05K 2201/096* (2013.01); *H05K 2201/09227* (2013.01); *H05K 2201/09536* (2013.01); *H05K 2203/1438* (2013.01); *H05K 2203/166* (2013.01); *Y10T 29/49165* (2015.01)

(58) Field of Classification Search
CPC ...... H05K 1/144; H05K 3/0047; H05K 3/108; H05K 3/4076; H05K 3/4623; H05K 3/4638; Y10T 29/49165; Y10T 29/49155; Y10T 29/4913; Y10T 29/49124; Y10T 29/49117; Y10T 29/49002
USPC .............. 29/852, 846, 832, 829, 825, 592.1
See application file for complete search history.

(56) References Cited

U.S. PATENT DOCUMENTS

| | | | |
|---|---|---|---|
| 2007/0256298 A1* | 11/2007 | Reinhold | B23Q 17/22 29/729 |
| 2008/0236881 A1* | 10/2008 | Tanaka | H05K 1/0219 174/266 |
| 2010/0307807 A1* | 12/2010 | Noda | H05K 1/115 174/264 |
| 2015/0007933 A1* | 1/2015 | Iketani | H05K 3/429 156/247 |
| 2015/0208514 A1* | 7/2015 | Thomas | H05K 3/429 205/125 |
| 2016/0295707 A1 | 10/2016 | Takano et al. | |

\* cited by examiner

*Conventional Process*

*Improved Hole Relative Position and Accuracy Process*

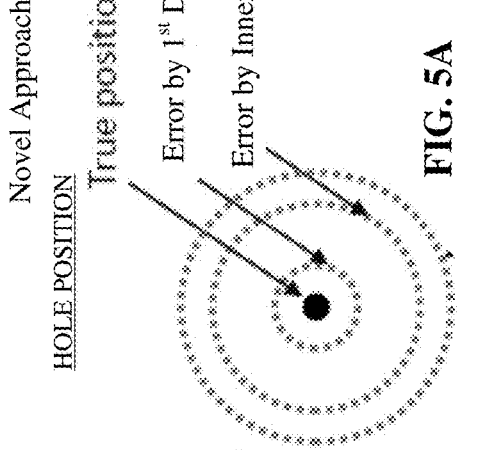
FIG. 4A
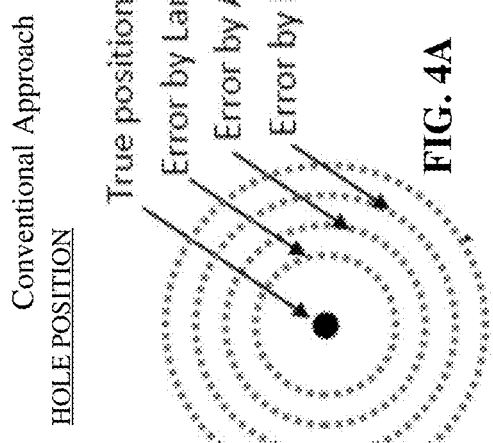
FIG. 5A
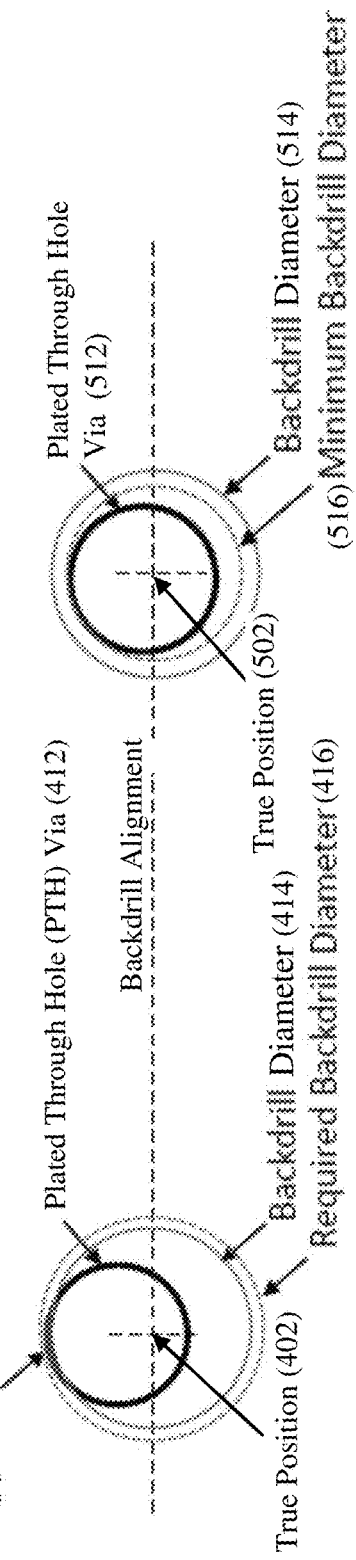
FIG. 5B
FIG. 4B

MULTILAYER PRINTED CIRCUIT BOARD VIA HOLE REGISTRATION AND ACCURACY

CLAIM OF PRIORITY UNDER 35 U.S.C. § 119

The present application claims priority under 35 U.S.C. § 119 to U.S. Provisional Application No. 62/407,807 entitled, "Improved Multilayer Printed Circuit Board Via Hole Registration and Accuracy," filed Oct. 13, 2016, and hereby expressly incorporated by reference herein.

FIELD

This application relates to methods of forming plated via holes in multilayer printed circuit boards. More particularly, this application relates to methods of forming plated via holes with improved alignment among multiple layers to reduce back drilled hole size.

BACKGROUND

In multilayer printed circuit board (PCB) processing, the multiple layers of a PCB are typically imaged (e.g., to form circuit paths, pads, antipads, etc.), laminated and/or stacked, and then drilled to form vias. However, this process tends to introduce misalignments among the multiple layers of the PCB, which often necessitate the use of larger pads, anti-pads, and/or restrict the minimum size of pads/anti-pads that can be used. Moreover, misalignments between via pads along a multilayer PCB may also cause signal integrity problems in adjoining/adjacent conductive traces.

What is needed is a way to more accurately form via holes in a multilayer printed circuit board to permit the use of smaller pads/anti-pads and/or to provide a more consistent distance to adjoining/adjacent conductive traces along multiple layers of a multilayer PCB.

BRIEF DESCRIPTION OF THE DRAWINGS

FIGS. 4A and 4B illustrate the errors introduced in forming a via hole across multiple layers of a printed circuit board using the conventional approach of FIG. 1.

FIGS. 5A and 5B illustrate the errors introduced in forming a via hole across multiple layers of a printed circuit board using the improved approach of FIG. 2.

DETAILED DESCRIPTION

In the following description, specific details are given to provide a thorough understanding of the various aspects of the disclosure. However, it will be understood by one of ordinary skill in the art that the aspects may be practiced without these specific details. For example, well known steps in a method of a catalyzing process may be omitted from flow diagrams presented herein in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation.

The present invention will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In other instances, well known process steps and/or structures have not been described in detail in order to not unnecessarily obscure the description.

Conventional Process for PCB and Via Hole Formation

Figure 1:
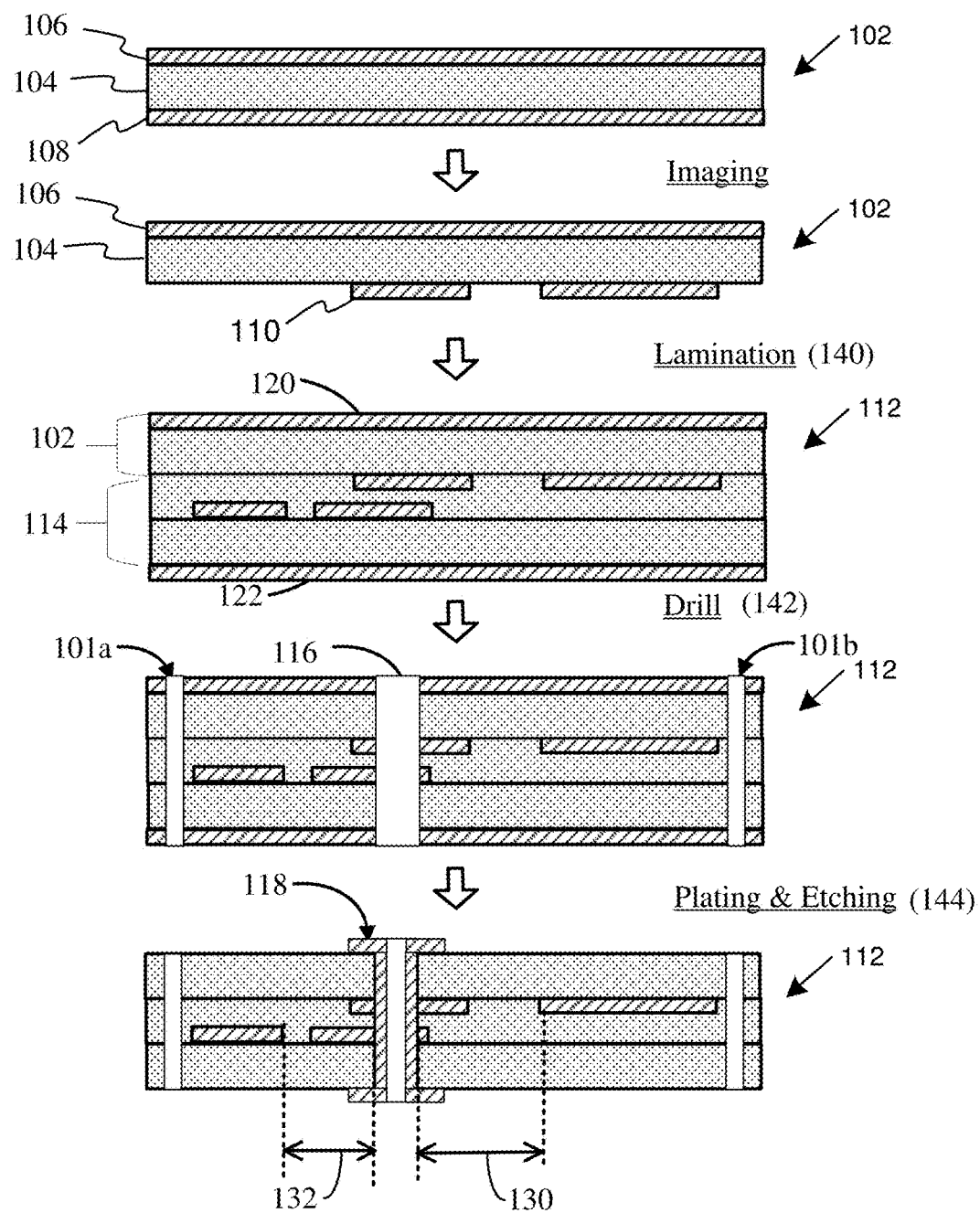
FIG. 1 illustrates exemplary stages of a conventional process for forming a printed circuit board and via hole.

FIG. 1 is an exemplary conventional process for forming a printed circuit board and via hole. A core layer 102 may be formed from a dielectric layer 104 with conductive layers 106 and 108 on either side. Imaging or etching may then be performed on one or both of the conductive layers 106 and 108 to form a conductive circuit 110 (e.g., pads, anti-pads, conductive traces, etc.). In one or more lamination stages, additional dielectric and conductive layers 114 may be added to the one or both sides of the core layer 102 to form a multilayer printed circuit board (PCB) 112. In this lamination stage, the one or more dielectric layers may be cured or semi-cured, which may cause some distortion or misalignment among the conductive layers. For instance, in this example, a first pad 120 is misaligned relative to a second pad 122.

Some through-holes 101a and 101b may be drilled through the PCB 112 for the alignment during the drill process and outer layer imaging process. These alignment hole 101a and 101b positions may be calculated as the average of inner layer feature position using a x-ray machine. Once multiple layers of the printed circuit board 112 are laminated, a via hole 116 may then be drilled through the multilayer printed circuit board 112 and through one or more pads 120 and 122.

In one or more subsequent plating and/or etching stage(s), the via hole 116 may be plated to form a via 118 that electrically couples to one or more pads of the multilayer printed circuit board 112. Note that, in this example, outer conductive layers of the multilayer printed circuit board 112 are etched to form electrical pads, anti-pads, and/or traces. However, as can be perceived, the misalignment of pads 120 and 122 in the multilayer PCB 112 may be a cause of substantial offset on the hole to conductive feature distance 130 and 132. This offset tolerance is very small at in radio frequency (RF) application PCBs due to short wave length. However, the conventional process on FIG. 1 cannot eliminate the misalignment error from the lamination process because of shrink or expansion during heat excursion and polymerization of the resin as well as drill positioning error.

Improved Process for PCB and Via Hole Formation

Figure 2:
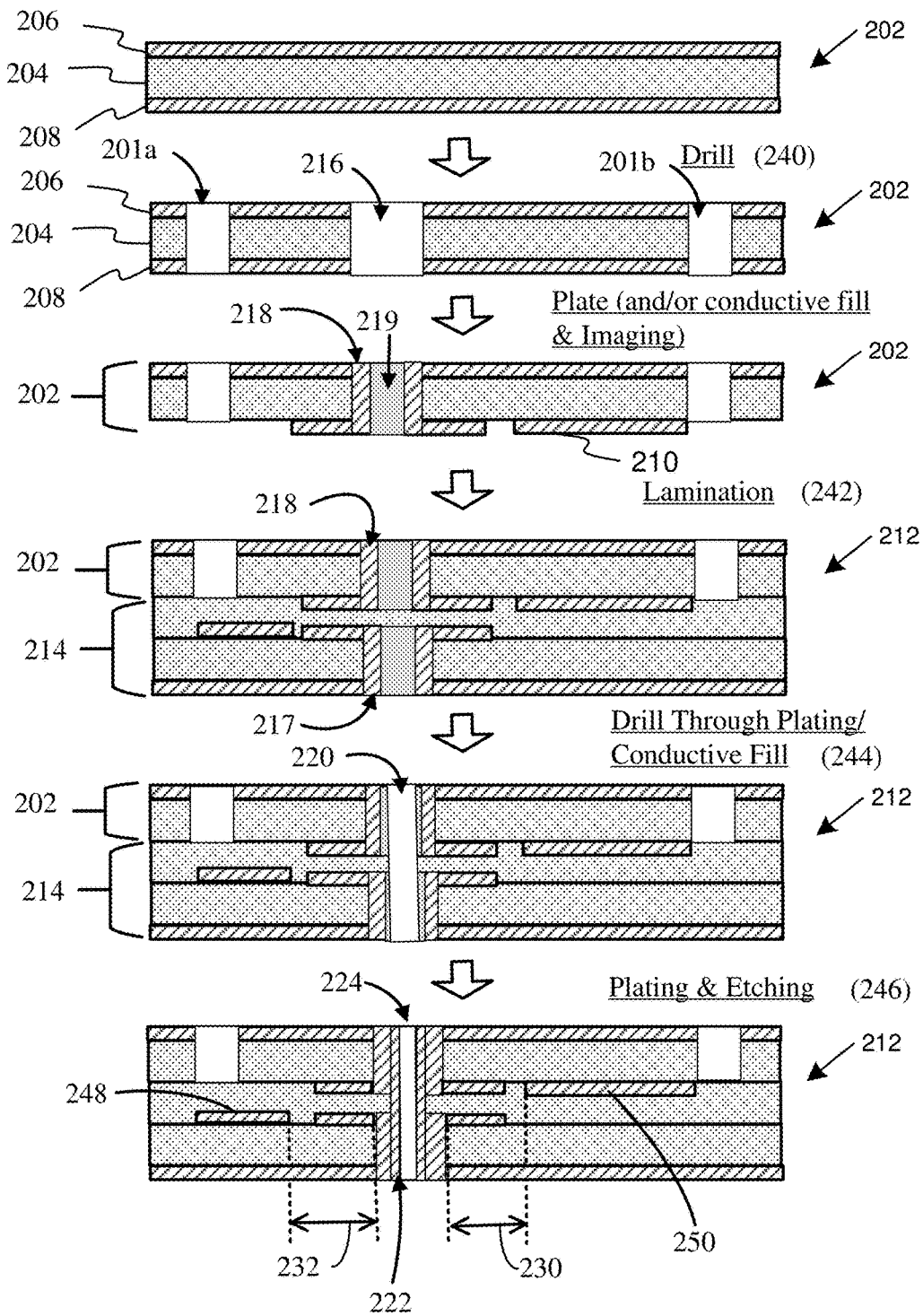
FIG. 2 illustrates exemplary stages of an improved process for forming a printed circuit board and via hole.

FIG. 2 is an exemplary improved process for forming a printed circuit board and via hole. A core layer 202 may be formed from a dielectric layer 204 with conductive layers 200 and 208 on either side. At the first drill stage, at the expected location(s) of vias, a via hole 216 may be drilled through the core layer 202. The drilling of the via hole 216 may be done to a first diameter. Additionally, registration through holes 201a and/or 201b (e.g., used for alignment of a PCB) may be formed during the first drill stage.

The via hole 216 may then be plated to form a conductive via segment 216. In various examples, the conductive via may be formed with conductive fill material 219, or the conductive via segment 218 may be formed by plating and adding conductive fill in a composite process. One or both conductive layers 206 and/or 208 may be imaged and/or etched to form conductive pads, anti-pads, and/or traces 210. The core layer 202 may be cured prior to drilling and etching.

Additional core layers 214 may be similarly formed, and vias may be pre-drilled and pre-formed, prior to one or more lamination stages which combine the dielectric and conductive layers into a multilayer printed circuit board (PCB) 212. Consequently, via segments 217 and 218 are formed and plated even before lamination occurs.

After the multilayer PCB 212 is formed, a via hole 220 is formed by a second drilling stage 244 with a second diameter that is smaller than the first diameter. Such drilling may be through the conductive fill material 219 and/or the first plating of the via segments 217 and 216. A second plating 222 may then be performed through the via hole 220 to form a through via 224 (e.g., first plating of via segments prior to lamination, and second plating after lamination). This approach of forming conductive via segments for each core layer prior to lamination, and then forming a via through all PCB layers (e.g., by backdrilling and then a second plating) permits the distances for all via segments to adjacent traces to be controlled (e.g., make distance from via to adjacent traces the same across all layers), thereby improving signal integrity in these adjacent traces.

Imaging or etching may also be performed on one or both outer conductive layers of the multilayer printed circuit board 212 to form a conductive circuit (e.g., pads, anti-pads, conductive traces, etc.).

The distance 230 and 232 between the plated through hole 224 and nearby conductive features 246 and 250 (e.g., adjacent traces, pads, etc.) has been fixed (e.g., kept constant) by the inner via layer process (e.g., first plating) and would not be influenced by the through hole drill process 244. Therefore, this dual via plating process can eliminate an error from lamination and through hole drilling.

Figure 3:
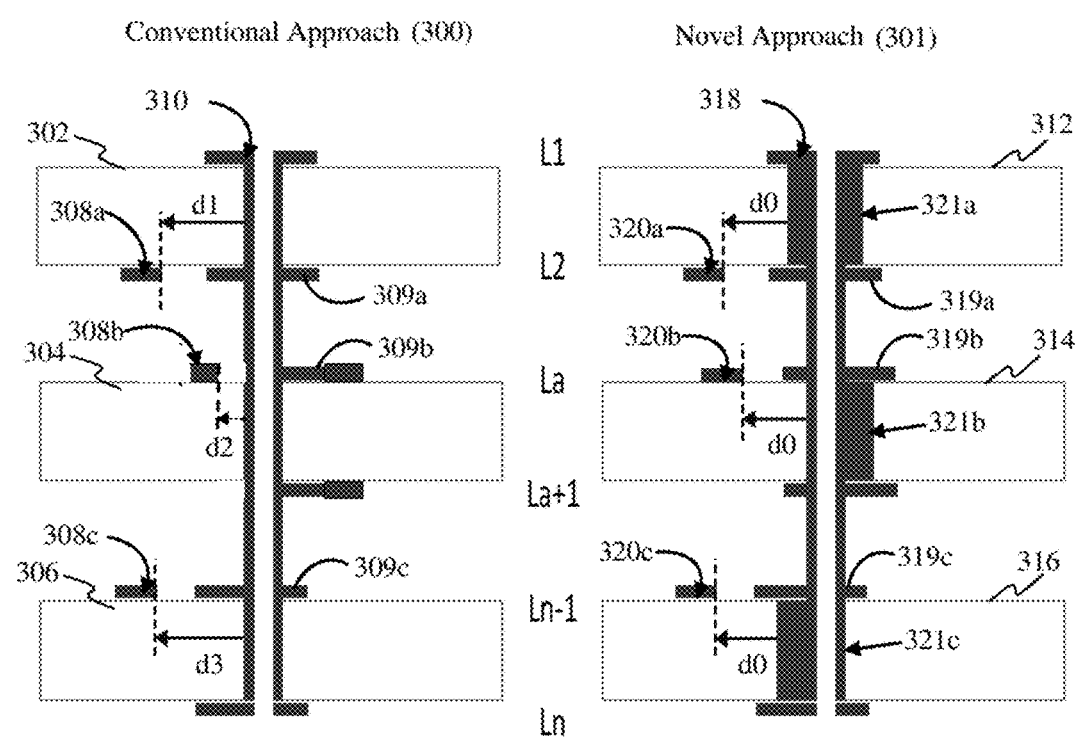
FIG. 3 further illustrates how the dual via plating approach illustrated in FIG. 2 may help maintain distances with adjacent/nearby conductive features/traces relative to a conventional approach.

FIG. 3 further illustrates how the dual via plating approach illustrated in FIG. 2 may help maintain distances with adjacent/nearby conductive features/traces relative to a conventional approach. In the conventional approach 300, multiple layers (L1/L2, L3/L4, and L5/L6) 302, 304, and 306 may be imaged for form electrical pads 309 and traces 308. These multiple layers 302, 304, and 306 may then be laminated together to form a multilayer PCB. During the lamination process, the alignment of the desired via position (via pads 309a, 309b, and 309c) for each layer may shift relative to other layers. After lamination, a hole is drilled and then plated to form an electrically conductive via 310. However, due to the misalignment that may occur during lamination, the distances d1, d2, and d3 between the through via 310 and adjacent conductive features/traces 308a, 308b, and 306c may be different. As can be seen here, the distance d2 is very close to the via 310 relative to the other distances d1 and d3. These varying distances d1, d2, and d3 along multiple PCB layers may cause negative signal integrity effects at the traces 308a, 308h, and/or 308c.

In the improved approach 301, each individual layer core 312, 314, and/or 316 may be imaged and etched (e.g., to form conductive pads 319a, 319b, 319c and traces 320a, 320b, 320c) and also drilled and plated to form individual via segments 321a, 321b, and 321c. Subsequent to forming the individual via segments 321a, 321b, and 321c, the layer cores 312, 314, and 316 may be laminated together, backdrilling is performed through the via segments 321a, 321b, and 321c, and a second plating is performed to form the through via 318. As illustrated here, all of the adjacent features/traces 320a, 320b, and 320c have the same distance d0 (e.g., equidistant) to the trace 318 despite misalignment between the layers. By guaranteeing that these adjacent features/traces have the same distance d0 to the through via 318, the effects/interference of the signal passing through the via 318 on the adjacent features/traces 320a, 320b, 320c may be reduced, minimized, or predicted (to thereby improve the signal integrity on the features or traces 320). This is very important for PCBs carrying high frequency signals, e.g., above 14 GHz, especially for millimeter wave (30 GHz~) applications.

Improved Via Hole Registration and Accuracy

FIGS. 4 and 5 illustrate an exemplary plurality of errors that may be introduced in a conventional PCB via formation process as well as an improved PCB via formation process.

FIG. 4A illustrates the errors introduced in forming a via hole across multiple layers of a printed circuit board using the conventional approach of FIG. 1. For a true position 402 (e.g., targeted or desired position) of a via hole, a lamination error 404 may be introduced during the lamination stage 140 (FIG. 1). During the drilling stage 142 (FIG. 1), a drill alignment error 406 (e.g., error when aligning the drill), and a drilling error 408 (e.g., error caused by vibration of drill) may be introduced. A backdrill alignment error may be introduced during the stage 144 (FIG. 1). The drilling error 408 and backdrilling error may be caused by numerical control and drill bit deflection (e.g., vibration is a root cause of those).

Due to the accumulation of errors introduced by the conventional lamination and via formation process, a plated through hole (PTH) via 412 may become too much offset from the true position 402 and may cause copper residue in the hole at backdrill which has a designed backdrill diameter 414. Consequently, a rather large drill diameter 416 has to be used for adequate backdrill process around each via true position 402 in order accommodate such errors FIG. 4B, however, the PCB design may not allow such large drill diameters.

FIG. 5A illustrates the errors introduced in forming a via hole across multiple layers of a printed circuit board using the improved approach of FIG. 2. For a true position 502 of a via hole, a first via drilling error 504 may be introduced during the first drilling stage 240 (FIG. 2). During the inner layer imaging stage 242 (FIG. 2), an inner layer imaging error 506 may be introduced. However, because a smaller drill diameter is used in the second drilling stage 244 than in the first drilling stage, no error is introduced by the second drilling stage 244.

Due to the accumulation of fewer errors introduced by this improved lamination and via formation process, a plated through hole (PTH) via 512 may be located anywhere within the region of the backdrill bit diameter 514, which is now smaller than the backdrill diameter 410 using the conventional process. Consequently, a smaller diameter 516 it is now possible to use a minimum diameter and may achieve smaller feature/trace or tighter accuracy design or provide better yield than conventional processes.

Figure 6:
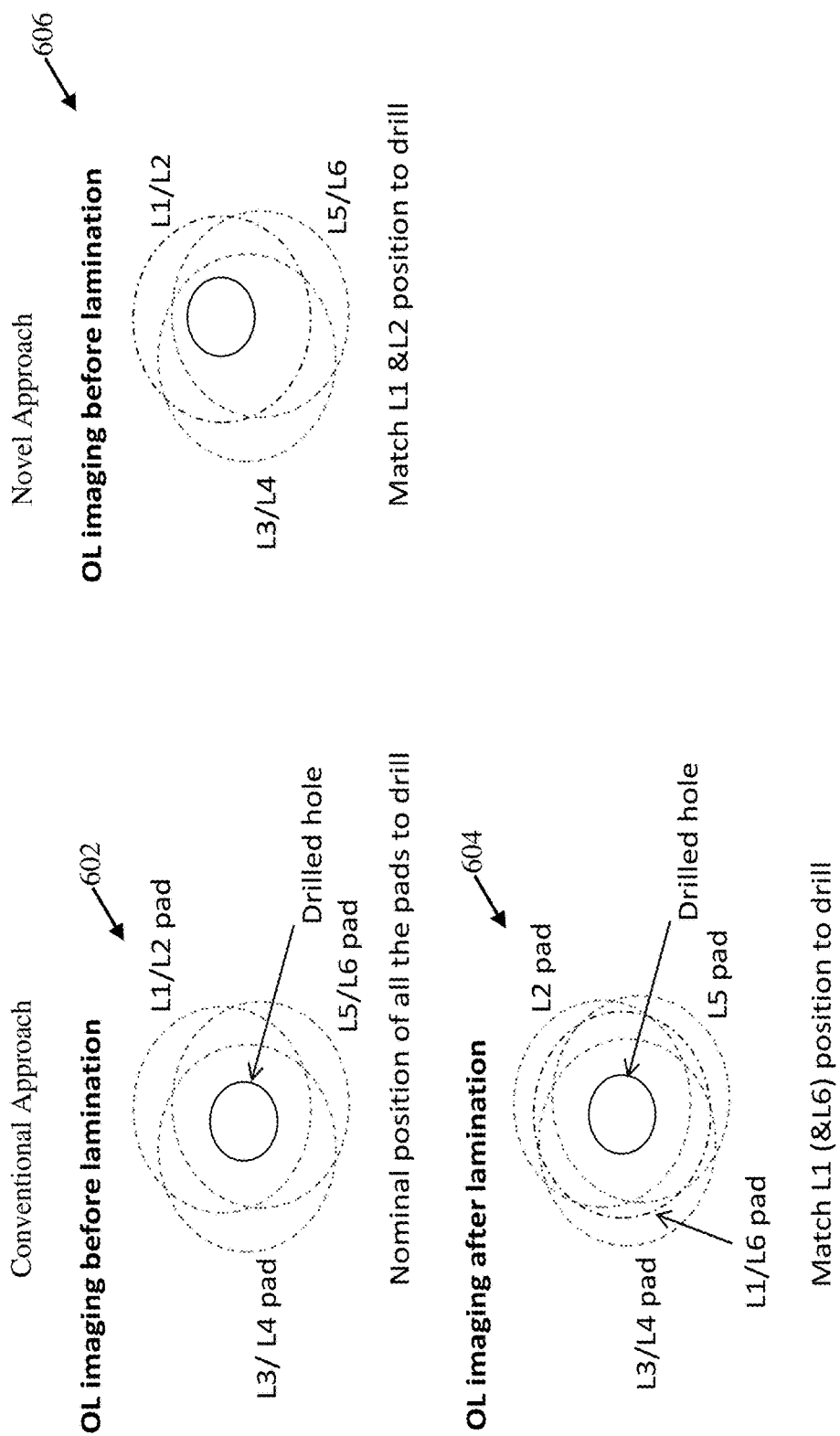
FIG. 6 illustrates alignment of via pads along multiple layers of a multilayer printed circuit board according to a conventional approach and novel approach to forming multilayer printed circuit boards with through vias.

FIG. 6 illustrates alignment of via pads along multiple layers of a multilayer printed circuit board according to a conventional approach and novel approach to forming multilayer printed circuit boards with through vias.

In a first conventional approach 602, the via hole is drilled at a nominal position over all the pads (for multiple layers L1, L2, L3, L4, L5 and L6). In this approach, the outer layer (OL) imaging is performed prior to lamination.

In a second conventional approach 604, imaging of the outer layer L1 and L6 is performed after lamination. Consequently, the drilled hole may be aligned to the position of the pads on the outer layers L1 and L6.

In a first novel approach 606, outer layer imaging is performed prior to lamination, so all via pads are imaged and etched on the individual cores prior to lamination. The hole position may then be aligned, for example, with pads on the first layers L1 and L2.

Methods for Forming Through Hole Via With Reduced Clearance Area

Figure 7:
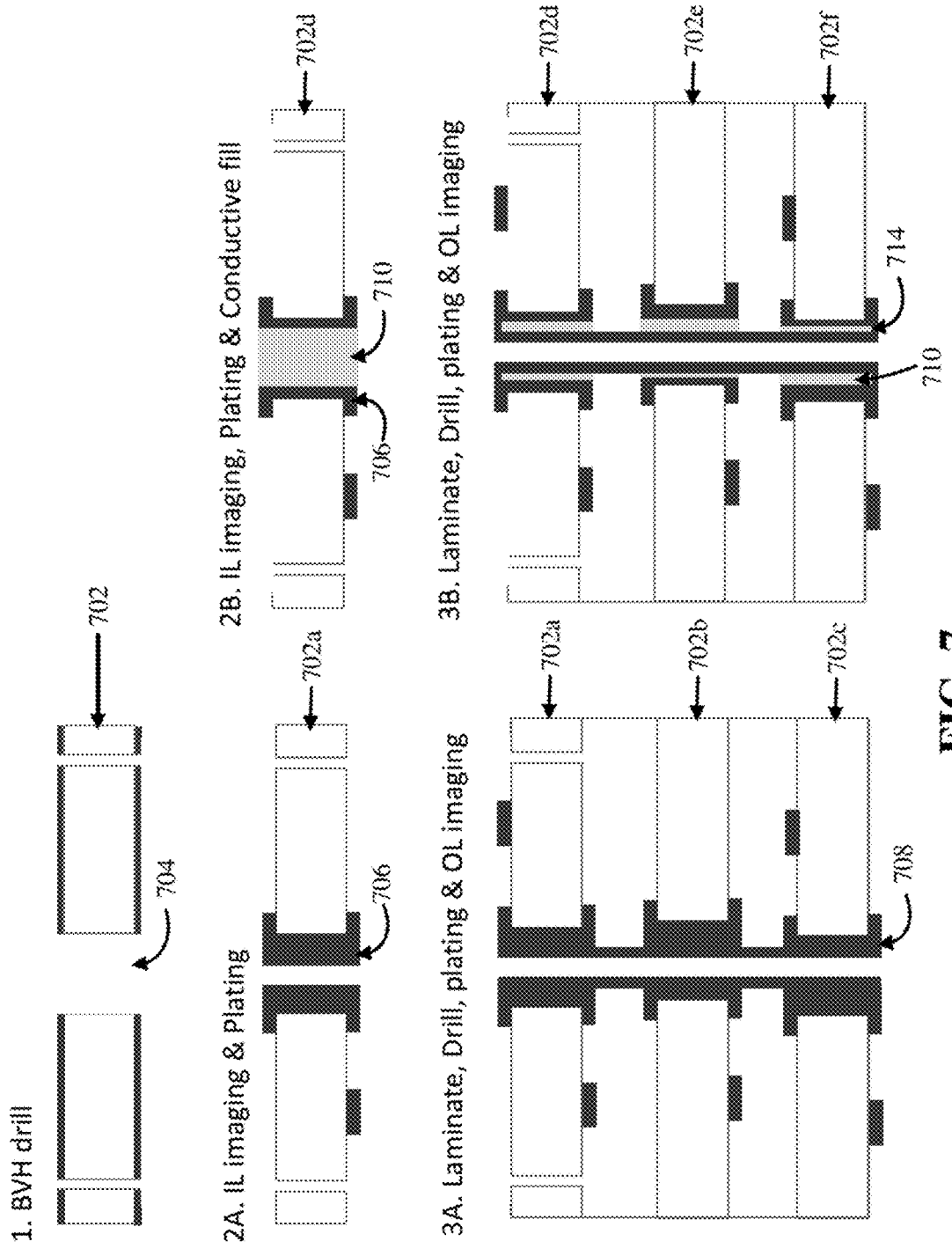
FIG. 7 illustrates a process for forming via holes in a multilayer printed circuit board with improved alignment and/or accuracy.

FIG. 7 illustrates a process for forming via holes in a multilayer primed circuit board with improved alignment and/or accuracy. A core 702 may comprise a dielectric layer between two conductive layers. A hole 704 is drilled through the core 702. The core 702 may then be imaged (e.g., to form traces and pads) and then the hole 704 is plated to form a via segment 706. In one approach, multiple cores 702*a*, 702*b*, 702*c* formed in this manner may then be laminated together. The via segments 706 across all cores 702*a*, 702*b*, and 702*c* may be backdrilled and plated a second time to form a through via 708. This approach is similar the approach 301 illustrated in FIG. 3.

In an alternative approach, the via segment 706 may be filled with a conductive filler/paste 710 prior to lamination. Then after lamination of multiple cores 702*d*, 702*e*, 702*f*, the via segments 706 across all cores 702*d*, 702*e*, and 702*f* may be backdrilled and plated a second time to farm a through via 714. The conductive filler/paste 710 may serve to fill-in voids in each via segment caused by misalignment between layers. Additionally, because the conductive filler/paste 710 is used, it reduces the amount of time of the second plating since less plating is needed to achieve the via walls formed by the second plating.

Figure 8:
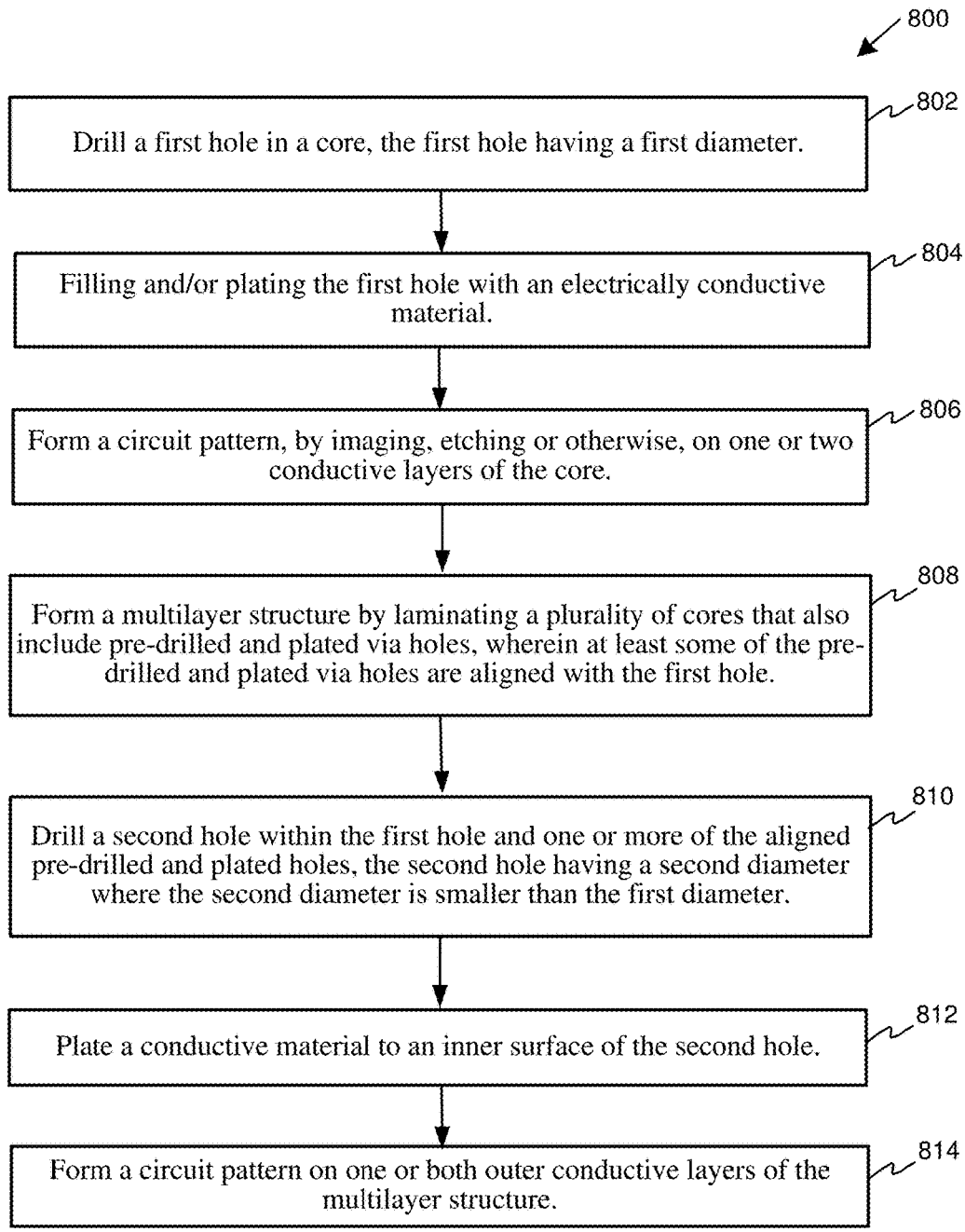
FIG. 8 illustrates an exemplary method for forming via holes in a multilayer printed circuit board with improved alignment and/or accuracy.

FIG. 8 illustrates an exemplary method for forming via holes in a multilayer printed circuit board with improved alignment and/or accuracy. A first hole may be drilled in a core or layer (e.g., having a dielectric layer between two conductive layers) the first hole having a first diameter 802. Some additional alignment holes may be concurrently drilled in the printed circuit board as a part of the first hole formation process. The drilled first hole may then be filled and/or plated with electrically conductive material 804. In one example, the conductive material used in the first hole may be copper plating, conductive fill material fill, or both. In some implementations, plating of the first hole may be done with copper plating to a minimum thickness of 10 micron (0.0004"), e.g., copper thickness of plating wall. In some instances, the conductive fill material may be cured conductive paste. A circuit pattern may then be formed, by imaging or otherwise, on one or two conductive layers of the printed circuit board 806. If the circuit patterning process is used semi-additive process, the conductive material deposition (804) and circuit patterning process (806) may process, simultaneously. In one example, the semi-additive process consists of follow process sequence:

1. Deposit negative circuit pattern on the PCB surface with plating resist
2. Apply copper plating
3. Remove the plating resist
4. Etch base copper A multilayer structure or PCB stack may be then be formed, e.g., by laminating multiple cores, that also include pre-drilled and plated via holes 808. The first hole and at least some of the pre-drilled and plated via holes may be aligned when the multilayer structure (cores) is laminated.

A second hole may be drilled within the first hole (and extending to one or more of the pre-drilled and plated via holes), the second hole having a second diameter that is smaller than the first diameter 810. A conducive material (e.g., copper) may be plated to the inner surface of the second hole 812. One or both outer conductive layers of the multiplayer structure (e.g., multilayer PCB) may then be imaged or etched to form one or more circuit patterns (e.g., pads, anti-pads, traces, etc.) 814.

The method may further include adding alignment mark holes to the primed circuit board contemporaneously with drilling of the first hole. Such alignment mark holes may serve to align the printed circuit board during drilling of the second hole. The alignment mark holes may be protected from being filled or plated with electrical conductive material. In one example, the alignment mark holes are blind holes. In another implementation, when aligning the drill prior to drilling the second hole, the first hole may also be used for alignment. In one instance, alignment holes may be drilled in the printed circuit board, the alignment holes having a third diameter different from the first diameter and second diameter. The third diameter may be, for instance, smaller or larger than the first and/or second diameter.

Where the printed circuit board is to be segmented into a plurality of printed circuit board segments, each PCB segment may include alignment mark holes.

In some implementations, the second drill diameter may be smaller by at least 10 micron (0.0004") than the first drill diameter.

In one embodiment, a multilayer printed circuit board structure is provided, including a first printed circuit board and one or more additional circuit boards. The first printed circuit board may include a first via hole having a first diameter and plated or filled with a conductive material. The one or more additional circuit boards may include one or more pre-drilled via holes that are aligned with the first via hole. The first via hole may include a first plating layer that is separate and distinct from a first plating of the pre-drilled via holes. The first via hole and pre-drilled via holes may have a second via hole of a second diameter extending there through and having a second plating layer.

In one example, the one or more pre-drilled via holes may include a first layer of conductive material distinct from the first plating layer of the first via hole.

In another example, the second plating layer may be distinct from the first plating layer and the first layer of conductive material.

The second plating layer may be distinct from the first plating layer. That is, the first plating layer and the second plating layer are done at distinct/separate plating processes.

The first printed circuit board may include a dielectric layer and at least one conductive layer. Similarly, the one or more additional circuit boards include one or more dielectric layers and conductive layers.

Backdrill Accuracy Improvement

Figures 9, 10:
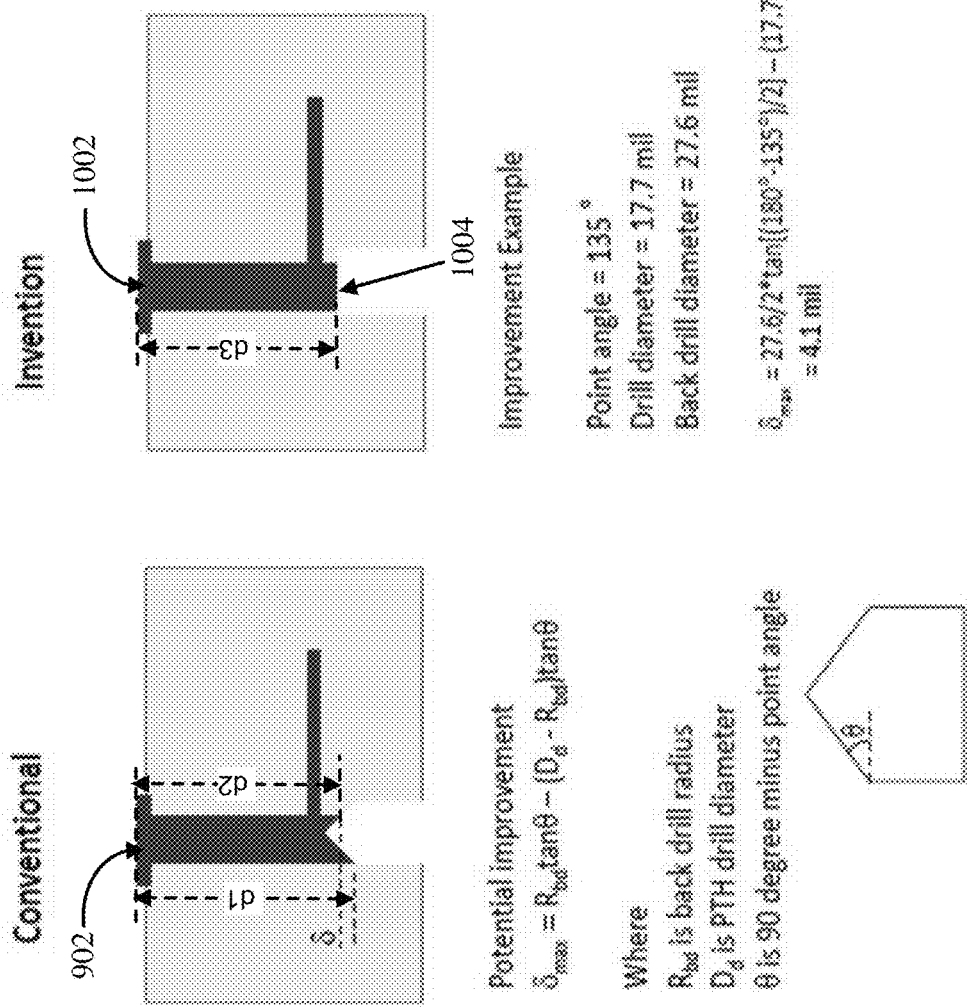
FIG. 9 illustrates a backdrill process of a plated through hole (PTH) using a conventional drill point having a point angle of θ.
FIG. 10 illustrates the use of a flat drill for backdrilling which creates an even internal edge and surface of the plated through hole.

FIG. 9 illustrates a backdrill process of a plated through hole (PTH) using a conventional drill point having a point angle of θ. In this approach, because of the diameter of the backdrill bit is larger than the plated through hole 902 (or may be off-center relative to the plated through hole 902 a conventional drill point may result in the internal edges of the plated through hole 902 to be uneven or have difference copper edge circum point distances d1 and d2 to a corresponding exterior surface circum point. For instance, this different distances d1 and d2 may result in a depth differential δ. This has certain undesirable effects, such as limiting the layer density of a PCB and/or causing signal reflection issues at higher frequencies.

According to one aspect, this undesirable feature is avoided by using a flat drill (e.g., 180 degree point angle) for backdrilling. FIG. 10 illustrates the use of a flat drill for backdrilling which creates an even internal edge and surface 1004 of the plated through hole 1002. With this technique, the internal edges of the plated through hole 1002 to be even or have the same copper edge circum point distances d3 to a corresponding exterior surface circum point.

Figure 11:
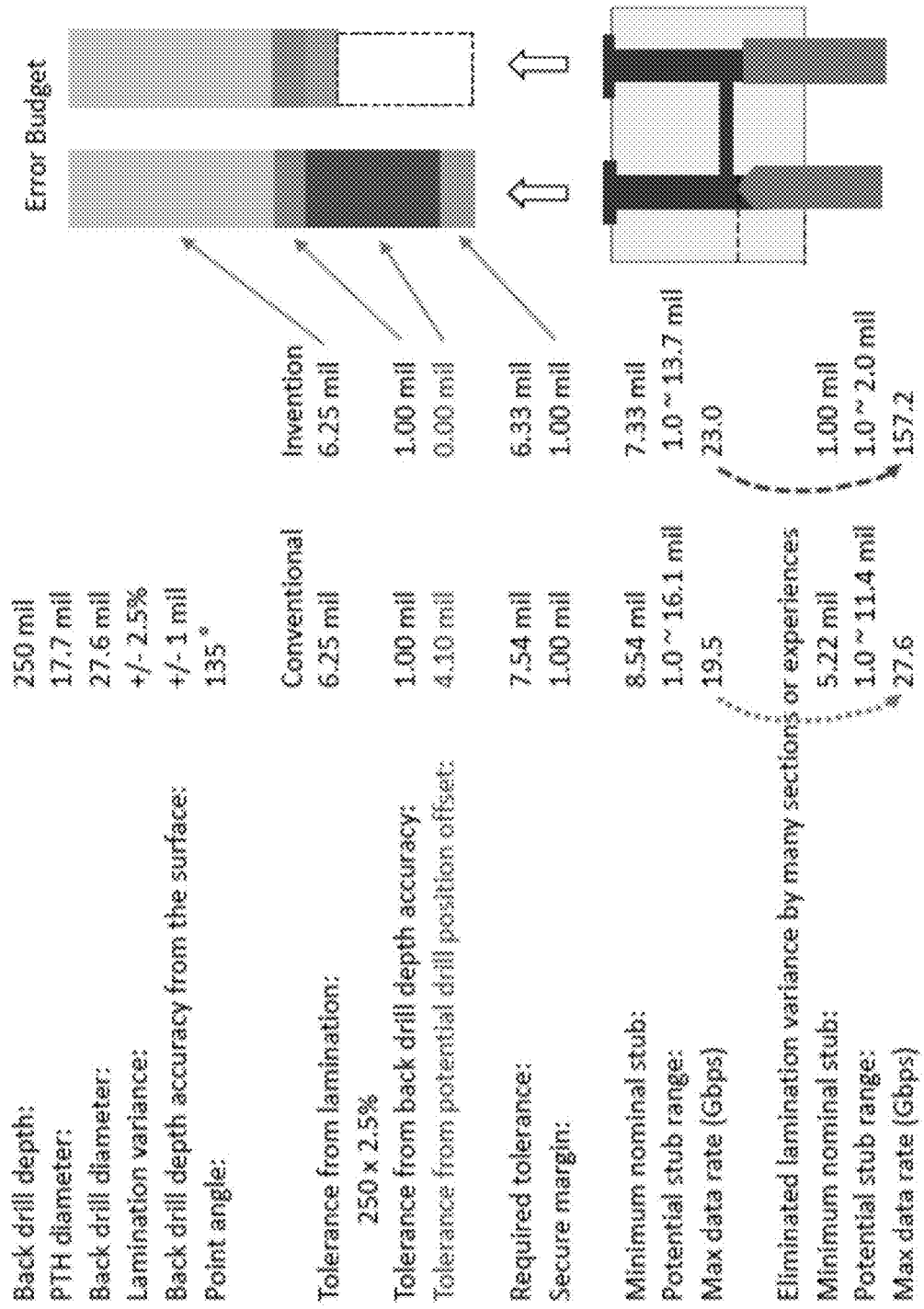
FIG. 11 illustrates an exemplary comparison between backdrilling with a conventional angle point drill bit and a flat-tip drill bit.

FIG. 11 illustrates an exemplary comparison between backdrilling with a conventional angle point drill bit and a flat-tip drill bit. With this approach, both the minimum nominal stub length/depth can be reduced (e.g., from approx. 5.22 mil to 1.00 mil) and the maximum data rate can be increased from 27.6 Gbps to 157.2 Gbps).

Note that the aspects of the present disclosure may be described herein as a process that is depicted as a schematic, a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A method of making accurate multilayer printed circuit hole to conductive feature geometry, comprising:

drilling a first hole in a first core, the first hole having a first diameter;

filling and/or plating the first hole with a first electrically conductive material;

forming a circuit pattern on one or two conductive layers of the first core;

forming a second core including a first pre-drilled via hole filled and/or plated with a second electrically conductive material;

combining the first core and the second core to form a multilayer structure with the first hole of the first core misaligned with the first pre-drilled via hole of the second core;

drilling a second hole within the first hole and the first pre-drilled via hole, the second hole having a second diameter where the second diameter is smaller than the first diameter; and plating a third electrically conductive material to an inner surface of the second hole to form a plated through hole extending through the first core and the second core, wherein a plating thickness of the conductive material plated to the inner surface of the second hole is at least 10 micron (0.0004").

2. The method of claim 1, further comprising:

forming a circuit pattern on one or both outer conductive layers of the multilayer structure.

3. The method of claim 1, further comprising:

adding alignment mark holes to the printed circuit board contemporaneously with drilling the first hole.

4. The method of claim 3, wherein the alignment mark holes are protected from being filled or plated with electrical conductive material.

5. The method of claim 1, wherein at least one of the first electrically conductive material, the second electrically conductive material, or the third electrically conductive material is copper plating, conductive material fill, or both.

6. The method of claim 1, where the second drill diameter is smaller than the first drill diameter by at least 10 micron (0.0004").

7. A multilayer printed circuit structure manufactured by the process comprising the steps of:

drilling a first hole in a first core, the first hole having a first diameter;

filling and/or plating the first hole with a first electrically conductive material;

forming a circuit pattern on one or two conductive layers of the first core;

forming a second core including a first pre-drilled via hole filled and/or plated with a second electrically conductive material;

combining the first core and the second core to form a multilayer structure with the first hole of the first core misaligned with the first pre-drilled via hole of the second core;

drilling a second hole within the first hole and the first pre-drilled via hole, the second hole having a second diameter where the second diameter is smaller than the first diameter; and plating a third electrically conductive material to an inner surface of the second hole to form a plated through hole extending through the first core and the second core, wherein a plating thickness of the third electrically conductive material is at least 10 micron (0.0004").

8. The multilayer printed circuit structure manufactured by the process of claim 7, further comprising the step of:

forming a circuit pattern on one or both outer conductive layers of the multilayer structure.

9. The multilayer printed circuit structure manufactured by the process of claim 7, further comprising the step of:

adding alignment mark holes to the printed circuit board contemporaneously with drilling the first hole.

10. The multilayer printed circuit structure manufactured by the process of claim 9, wherein the alignment mark holes are protected from being filled or plated with electrical conductive material.

11. The method of claim 1, wherein:
   forming the circuit pattern on one or two conductive layers of the first core comprises forming a circuit pattern on one or two conductive layers of the first core, the circuit pattern including a first conductive feature a first distance from the first hole;
   forming the second core further comprises forming the second core including a second conductive feature a second distance from the first pre-drilled via hole; and
   where the formed plated through hole maintains the first distance from first conductive feature and the second distance from the second conductive feature.

12. The multilayer printed circuit structure manufactured by the process of claim 7, wherein:
   forming the circuit pattern on one or two conductive layers of the first core comprises forming a circuit pattern on one or two conductive layers of the first core, the circuit pattern including a first conductive feature a first distance from the first hole;
   forming the second core further comprises forming the second core including a second conductive feature a second distance from the first pre-drilled via hole; and
   where the formed plated through hole maintains the first distance from first conductive feature and the second distance from the second conductive feature.

* * * * *